United States Patent [19]

Davis et al.

[11] 3,808,515

[45] Apr. 30, 1974

[54] CHOPPER DEVICES AND CIRCUITS

[75] Inventors: James Alvin Davis; William Shockley, both of Stanford, Calif.

[73] Assignee: Bell Telephone Laboratories, Incorporated, Murray Hill, N.J.

[22] Filed: Nov. 3, 1972

[21] Appl. No.: 303,538

[52] U.S. Cl..... 321/69 R, 317/234 UA, 317/235 A, 323/93

[51] Int. Cl. ............................................ H02m 5/30

[58] Field of Search.................... 307/256, 258, 304; 317/234 UA, 235 A; 321/69 R, 69 NL, 70; 323/93

[56] References Cited

UNITED STATES PATENTS

| | | | |
|---|---|---|---|
| 3,206,670 | 9/1965 | Atalla | 323/93 |
| 2,527,215 | 10/1950 | Hahn | 323/93 X |
| 2,991,371 | 7/1961 | Lehovac | 317/234 UA |
| 3,237,018 | 2/1966 | Leger | 317/235 A |
| 3,161,816 | 12/1964 | Holcomb | 321/69 NL |
| 3,502,884 | 3/1970 | Perlman et al. | 317/234 UA |
| 3,549,980 | 12/1970 | Getchell | 321/69 R |

*Primary Examiner*—A. D. Pellinen
*Attorney, Agent, or Firm*—R. B. Anderson

[57] ABSTRACT

In one embodiment, a chopper circuit includes two chopper devices each comprising, for example, a semiconductor wafer with two p-type regions on opposite planar surfaces separated by an n-type region. A chopping voltage applied to the n-type region periodically drives the wafer between the p-type layers to a fully depleted condition. The parallel p-type regions then constitute capacitor plates, which are periodically shielded from each other at the chopping frequency, when the n-type region reverts to an undepleted condition. With the chopping voltage applied 180° out-of-phase to the two devices, a low frequency signal voltage applied between the two devices will be converted to a relatively high frequency with little noise being introduced and with the chopper voltage component being inherently separated from the output converted signal frequency.

8 Claims, 5 Drawing Figures

CHOPPER DEVICES AND CIRCUITS

BACKGROUND OF THE INVENTION

This invention relates to electrical chopper apparatus, and more particularly, to chopper apparatus used to convert a low power, low frequency signal to a higher frequency so as to facilitate signal amplification.

One known technique for amplifying low frequency, low power signals is to use a chopper device to increase the frequency of the signal so that it can conveniently be amplified by an ac amplifier. A chopper may consist simply of a mechanical switch for interrupting the signal at a relatively high frequency rate, thereby to convert it to a higher frequency that can be efficiently amplified. Such techniques are sometimes employed to detect very low power biological signals, low frequency acoustic energy, and the like.

Any electrical or mechanical switch may of course introduce noise into the chopping operation which is harmful in the detection of low power signals. Related to the noise problem is that of separating the chopper frequency component from the signal component after amplification. Further, as is true with all circuits, the impedance of the source should be matched to that of the load so as to give appropriate impedance matching without introducing spurious noise.

SUMMARY OF THE INVENTION

Accordingly, it is an object of this invention to provide a chopper for increasing or "up-converting" the frequency of a low power, low frequency, high impedance signal.

It is another object of this invention to reduce the problems associated with the separation of the chopping frequency from the signal frequency in apparatus using frequency chopping for the detection of low power signals.

It is still another object of the invention to reduce the noise problems associated with chopping and amplification of a low power signal.

These and other objects of the invention are attained in an illustrative mechanical embodiment thereof comprising a mechanically rotatable, grounded flat shield that alternately shields the parallel plates of two capacitors. It will be shown that, in the absence of any input signal, no output voltage of frequency $f$ will be generated by the capacitors, where $f$ is the frequency of rotation; rather the output will be at integral multiples of $2f$. However, if a dc signal or a low frequency signal is produced between the two input plates of the two capacitors, it will be manifested as an output signal of frequency $f$. Thus, frequency up-conversion is achieved in a manner which inherently separates the converted signal frequency at the output from the output chopping frequency.

It is an object of one embodiment of the invention to provide a semiconductor chopper which is physically compact and which displays other known advantages of semiconductor devices.

In a semiconductor embodiment of the invention, the two capacitors are each defined by a pair of contact regions on opposite sides of a semiconductor wafer which form rectifying junctions with the wafer. The chopping voltage is applied to the two chopping devices by way of an annular ohmic contact surrounding each of the wafers. The chopping voltage causes the wafer to vary between depleted and undepleted states; that is, the chopping voltage periodically applies a sufficient reverse-bias to deplete current carriers of the region between the two rectifying junctions.

When the wafer between the two junctions is fully depleted, the opposite contacts form an unshielded capacitor. But when the wafer is undepleted, the opposite contact regions are shielded from each other and are not capacitively coupled. Thus, the chopping voltage effects the same function as the rotating shield in the mechanical embodiment; i.e., it causes periodic shielding between the two plates of a parallel plate capacitor. With the chopping voltage of frequency $f$ applied 180° out-of-phase to the two chopper devices, the output chopper voltage is essentially of a frequency $2f$, while any low frequency voltage applied between the two chopper devices will be at or near the frequency $f$, as before.

In addition to giving inherent frequency separation between the output signal and chopping voltages, our invention introduces little or no noise to the signal. Further, it is a relatively high impedance device and is therefore compatible with signals originating at a high impedance signal source.

These and other objects, features and advantages of the invention will be better understood from a consideration of the following detailed description taken in conjunction with the accompanying drawings.

DRAWING DESCRIPTION

DETAILED DESCRIPTION

Figure 1:
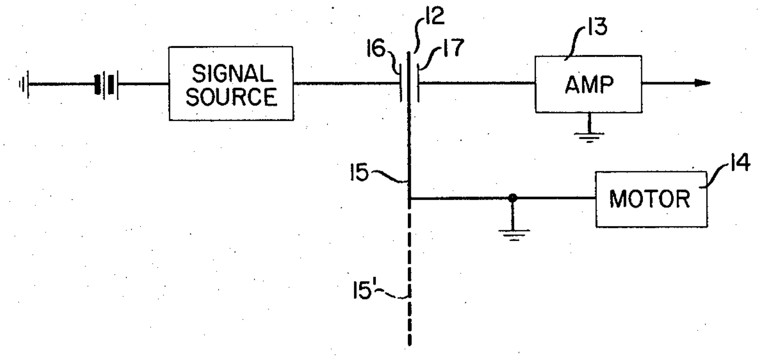
FIG. 1 is a schematic view of one embodiment of the invention.

Referring now to FIG. 1 there is shown chopper apparatus, illustrating certain principles of the invention, comprising a parallel plate capacitor 12, an ac amplifier 13, and a motor 14 for rotating a shield 15 to shield periodically the two plates of capacitor 12. A signal to be increased in frequency by chopping is applied to an input plate 16 of the capacitor and derived from an output plate 17 for amplification. As is known, chopper devices are frequently used to increase the frequency of low frequency, low power signals, for more efficient amplification by ac amplifiers.

The shield 15 is illustratively a flat conductive plate eccentrically mounted on the rotatable shaft of motor 14. As the shaft rotates, the shield oscillates between the position shown, at which it shields capacitor plates 16 and 17, and a position 15', at which it does not shield the plates. When in the position shown, shield 15 capacitively shunts signal energy to ground, thereby interrupting current flow through the capacitor. Thus, the device interrupts the circuit at the motor frequency $f$, thereby increasing by frequency $f$ the frequency of energy delivered to the amplifier.

One drawback of the device of FIG. 1 is that, after ac amplification, the signal frequency component must be separated from the chopper frequency component. This problem is inherently avoided by the embodiment of FIG. 2 which uses a symmetrical circuit comprising two capacitors 20 and 21, each having parallel plates 22, 23 and 24, 25, respectively. The component plates of the two capacitors are periodically shielded by a rotatable flat conductive shield 27 driven by a motor 28. The signal to be increased in frequency is applied between input plates 22 and 24 of the two capacitors by signal source 29. The chopped signal frequency is derived from plates 23 and 25 for amplification by an ac amplifier.

As before, the rotating shield 27 periodically interrupts the circuit by shunting current to ground as it moves between opposite capacitor plates. Assuming that the circuit is electrically and mechanically symmetrical, it can be seen that the shield plate 27 alternately shields capacitors 20 and 21, thereby interrupting the circuit at frequency *2f*, twice the motor frequency. Thus, if no signal is applied by signal source 29 it is evident that the output voltage detected by the amplifier will have a component at 2f, but no component at the motor frequency *f*.

Any voltage difference between the two imput plates 22 and 24 results in a fluctuation of the voltage output. Thus, any small dc voltage applied by source 29 will be manifested as an ac output voltage component at frequency *f* which may be amplified and conveniently separated from the chopper frequency *2f*. If the input signal has a low frequency, the output signal frequency component will be centered about frequency *f* which is likewise easily separated from the effective chopping frequency *2f*. If desired, various steady-state dc voltages may be placed on various parts of the circuit. For example, the input plates 22 and 24 may be at a different steady-state dc bias voltage than the shield plate 27 to reduce the amplitude of the unwanted output component at 2f.

Figure 3:
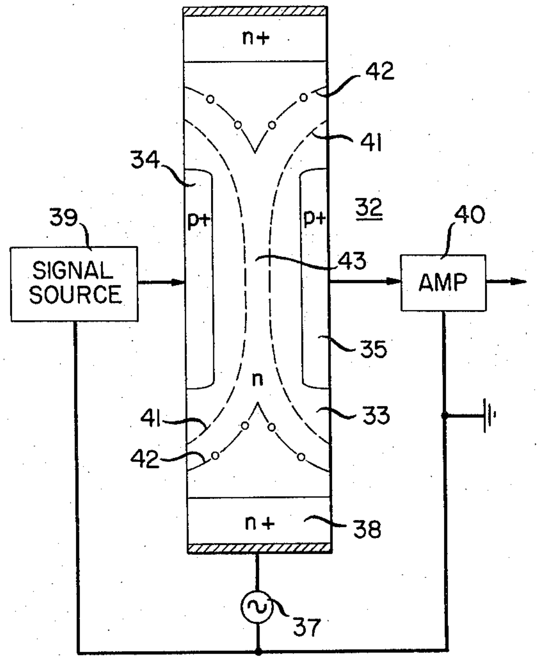
FIGS. 3 and 5 are schematic views of semiconductor chopper devices that may be used in other embodiments of the invention.

Referring now to FIG. 3 there is shown a semiconductor chopper device 32 which is capable of performing the function of the periodically shielded capacitor 12 of FIG. 1. The chopper device illustratively comprises a cylindrical wafer, the major, or bulk, portion 33 of which is n-type, and, having on opposite sides, diffused p+ regions 34 and 35. The p-n junctions between regions 34 and 35 and the n-type region 33 are periodically reverse-biased by a sufficient voltage to deplete of current carriers that portion of the wafer 33 between regions 34 and 35. The periodic reverse-bias voltage is shown as being applied by an ac source 37 which makes ohmic contact around the periphery of the wafer by an annular n+ region 38.

When the n-type portion between regions 34 and 35 is fully depleted of current carriers, in this case electrons, regions 34 and 35 act as parallel plates of a capacitor, and any signal from a source 39 is capacitively coupled to the amplifier 40. On the other hand, if the reverse-bias voltage is insufficient to form a depletion region along the entire distance between regions 34 and 35, a neutral or undepleted channel 43 will extend between the two plates and shield them, much as does the metal shield 15 of FIG. 1. Thus, periodically varying the state of the wafer portion, connecting regions 34 and 35, between depleted and undepleted states may be used as the electrical equivalent of a mechanically driven shield. Equipotential lines 41 and 42 are included for showing typical extreme electric field distributions in the wafer during operation. Equipotential lines 42 may be taken as illustrating the boundary between the undepleted portion of the wafer and the depleted portion between regions 34 and 35 during the application of a high reverse-bias voltage. In this depleted condition, the input signal "sees" a parallel plate capacitor separated by a dielectric having a dielectric constant determined by the depleted wafer portion. When the reverse-bias voltage goes through the low portion of the cycle, equipotential lines 41 may typically constitute the boundaries of the depletion regions, in which case a neutral semiconductor channel 43 extends between regions 34 and 35, which shunts input signal currents. The potential of the channel 43, in respect to ground, is determined by the ac source 37.

Figure 2:
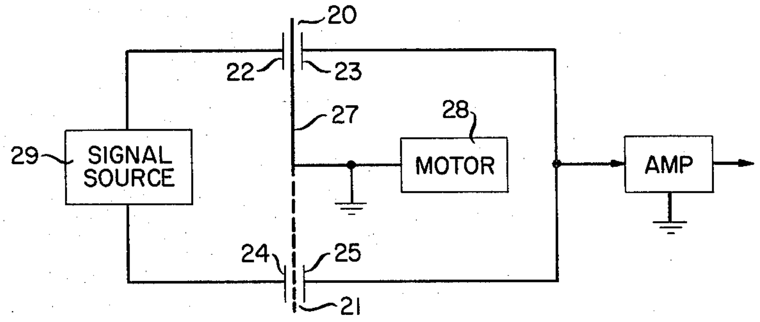
FIG. 2 is a schematic view of another embodiment of the invention.
Figure 4:
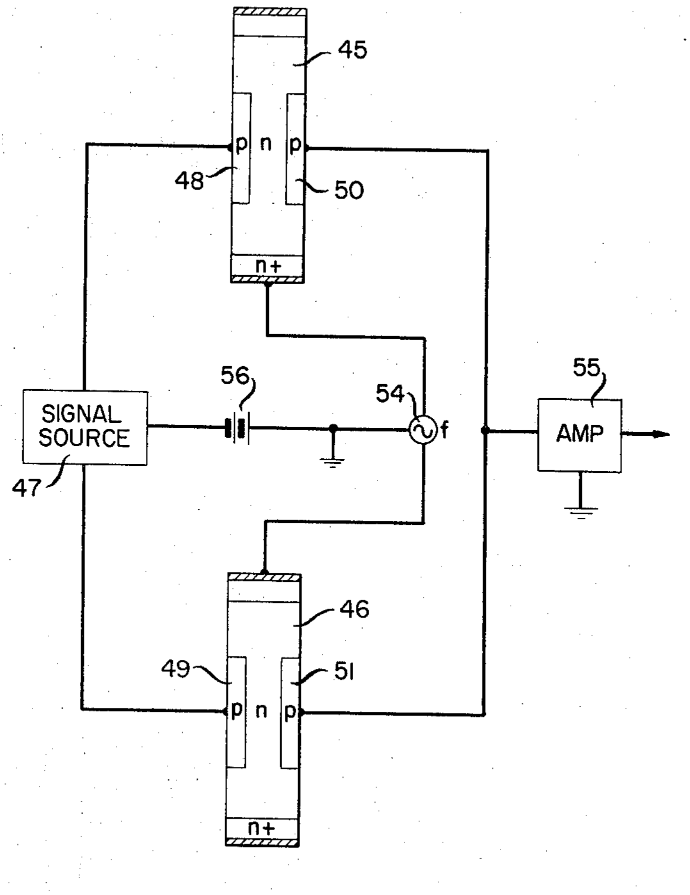
FIG. 4 is a schematic view of another embodiment of the invention using semiconductor chopper devices of the type shown in FIG. 3.

Referring now to FIG. 4 there is shown a semiconductor device version of the circuit of FIG. 2 in which semiconductor chopper devices 45 and 46 are substituted for the capacitors 20 and 21 of FIG. 2. Signal energy from a source 47 is applied to input regions 48 and 49 of the two chopper devices, while an output up-converted frequency is derived from output regions 50 and 51. An ac chopper frequency is applied to the two devices by a source 54 which applies energy to the two devices 180 degrees out-of-phase; that is, when regions 48 and 50 of device 45 are capacitively coupled due to carrier depletion, regions 49 and 51 of device 46 are shielded due to a neutral semi-conductor channel between them. Thus, in the absence of any input signal, the output frequency delivered to amplifier 55 has a major component at *2f*, or twice the chopper frequency supplied by source 54.

The FIG. 4 circuit is, of course, assumed to be symmetrical. As with FIG. 2, any signal impressed by signal source 47 is converted to an output having a frequency centered about frequency *f*, which is easily separated from the frequency *2f*. The devices 45 and 46 are preferably reverse-biased by a steady-state component supplied by dc source 56 so as to reduce the ac power required by source 54 and to increase frequency response. Thus, the source 56 may be sufficient to deplete the wafers, with the ac signal 54 being used to provide periodically a neutral channel during a small portion of each cycle, thereby to interrupt periodically the circuit paths as in FIG. 2.

The design of the semiconductor chopping devices and bias sources so as to provide alternate shielding and capacitive coupling are all matters well within the ordinary skill of a worker in the art. The device dimensions of course should be such that the depletion regions associated with the two junctions merge or "punch-through" at bias voltages below the avalanche breakdown voltage. The carrier concentration of the wafer should be sufficient to provide sufficiently dependable shielding in accordance with chopper circuit requirements.

In general, the designer should try to minimize the ac voltage amplitude within the wafer needed for circuit switching. This is particularly true in the balanced circuit of FIG. 4 in which the requirements for electrical symmetry increase with increasing ac voltage. Since it is known that the transition from a depletion region to a neutral region takes place in distance of approximately one Debye length, one could vary the neutral channel thickness from 0 (complete pinch-off) to about 10 Debye lengths (for dependable shielding). The "Debye length" is a well-known distance parameter commonly used in semiconductor technology. In minimizing the ac voltage, however, the designer should consider that there will be substantial capacitive coupling across neutral channels of appropriately small thickness. Thus, the channel thickness could be varied between one-half and 2 Debye lengths, or between one-tenth and 3 Debye lengths, depending on performance requirements, etc.

The circuit bias arrangement shown is of course merely illustrative, and different arrangements may be preferred, depending on such considerations as the nature of the signal source. The bias source is also a convenient device for compensating for unavoidable asymmetries that may be detected; for example, different bias levels on the two chopper devices may compensate for different device capacitances.

Figure 5:
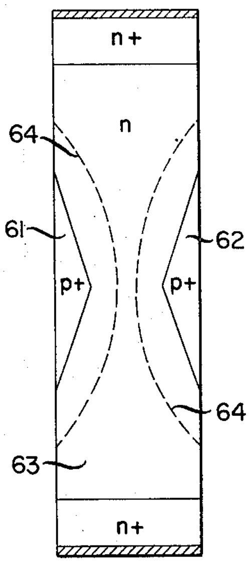

Referring now to FIG. 5, there is shown another embodiment of the semiconductor chopping device of FIG. 3 in which the configurations of the opposite *p*+ regions 61 and 62 have been modified to optimize the electric field distribution in wafer 63, as illustrated by equipotential lines 64. The FIG. 5 device permits a higher chopping frequency by reducing the time required for either "pinching-off" or reducing the thickness of the neutral channel during each chopping cycle. The p-type regions 61 and 62 have conical configurations each with an apex at the central axis of the wafer. This geometry creates a significant radial electric field component which sweeps out carriers in the central portion of the wafer when the device is biased to depletion. By comparison, the radial electric field in FIG. 3 is negligible in the wafer central portion. Consequently, in FIG. 5, the development of the pinched-off condition is hastened and the maximum operating frequency increased.

From the foregoing it is clear that semiconductor conductivities complementary to those shown could alternatively be used, and that other electronic barrier junctions such as Schottky barrier junctions or metal-insulator-semiconductor (MIS) junctions could be used. Further, numerous other configurations could be used to optimize either operating characteristics or convenience of fabrication. For example, advantage could be taken of integrated circuit techniques by using, as the n-type wafer, an n-type layer epitaxially grown on a p-type substrate. Appropriate p+ and n+ regions could be in the form of stripes diffused into the upper surface of the n-type epitaxial layer. One could then also easily control device capacitance by controlling the lengths of the diffused stripes. Also, combinations of four chopper devices with complementary polarities could be used so that the effects of opposite polarity shielding regions cancel out in producing disturbances in the source.

Numerous other embodiments and modifications may be made by those skilled in the art without departing from the spirit and scope of the invention.

What is claimed is:

1. A chopping device comprising:
a semiconductor wafer;
displaced first and second regions each defining an electronic barrier with the wafer;
means for applying a signal to the first region and for deriving the signal from the second region;
and means for increasing the frequency of said signal comprising means for periodically depleting a portion of the wafer between the first and second regions of majority current carriers, and then introducing majority current carriers into said portion;
said depleting means comprising means for applying a chopper voltage to the semiconductor wafer;
the wafer being of the same conductivity type for the entire distance between the chopper voltage applying means and the electronic barriers of the first and second regions.

2. The chopping device of claim 1 further comprising:
a chopping electrode connected to the semiconductor wafer;
and wherein the electronic barriers are rectifying junctions and the depleting means comprises means for periodically applying to the chopping electrode a voltage of a polarity as to reverse-bias said rectifying junctions, and of sufficient magnitude, with respect to the carrier concentration of the wafer, to deplete substantially completely a wafer portion extending substantially the entire distance between the first and second regions.

3. The chopper device of claim 2 wherein:
the chopping electrode comprises a substantially annular contact surrounding the wafer.

4. The chopper device of claim 3 wherein:
the annular contact has a central axis;
and the rectifying junctions are of a substantially conical configuration having an apex substantially coincident with the central axis, thereby to improve the electric field distribution in the wafer.

5. Electrical chopping apparatus comprising:
first and second chopper devices each comprising a semiconductor wafer and displaced first and second regions each defining a rectifying junction with the wafer;
means for applying a signal voltage between the first displaced regions of the two chopping devices and for deriving said signal from the second displaced regions of the two chopping devices;
means for applying a chopping signal to the semiconductor wafers of the first and second chopping devices, the chopping signal voltage being of sufficient magnitude to periodically deplete of current carriers a portion of each of the wafers between the respective first and second regions;
the chopping signal applied to the second chopper device being substantially 180° out-of-phase with respect to the chopping signal applied to the second chopper device.

6. The chopping apparatus of claim 5 wherein:
each of the chopper devices comprises an annular chopping electrode surrounding and making an ohmic contact to the wafer;
and wherein the chopping signal applying means comprises means for periodically applying to the chopping electrodes a voltage of a polarity as to reverse-bias said rectifying junctions, and of sufficient magnitude with respect to the carrier concentration of the respective wafers to deplete substantially completely wafer portions extending substantially the entire distance between the respective first and second junctions.

7. The chopping apparatus of claim 6 wherein:
the wafers of the chopper devices each have a central axis;

and the rectifying junctions are each of a substantially conical configuration having an apex substantially coincident with the central axis, thereby to improve the electric field distribution in each respective wafer.

8. Electrical chopper apparatus comprising:

first and second juxtaposed regions capable of being capacitively coupled;

third and fourth juxtaposed regions capable of being capacitively coupled;

means for applying a signal of a first frequency to the first and third regions;

means for deriving the signal from the second and fourth regions;

and means for chopping the signal at a second frequency comprising means for periodically electrically shielding the second region from the first region, and the fourth region from the third region, and for interrupting at the second frequency all current in the second region and the fourth region;

the relative phase of interruption of current in the fourth region being at substantially 180 degrees with respect to current interruption in the second region;

and means for combining the signal derived from the fourth region with the signal derived from the second region.

* * * * *